United States Patent [19]

Nakamura

[11] Patent Number: 5,764,527
[45] Date of Patent: Jun. 9, 1998

[54] OPTIMIZING METHOD FOR LOGIC CIRCUIT AND LOGIC CIRCUIT OPTIMIZING SYSTEM

[75] Inventor: Yuichi Nakamura, Tokyo, Japan

[73] Assignee: NEC Corporation, Tokyo, Japan

[21] Appl. No.: 549,548

[22] Filed: Oct. 27, 1995

[30] Foreign Application Priority Data

Jan. 17, 1995 [JP] Japan ................................. 7-004774
Apr. 24, 1995 [JP] Japan ................................. 7-097336

[51] Int. Cl.$^6$ ........................................... G06F 17/50
[52] U.S. Cl. ................................ 364/489; 364/488
[58] Field of Search ........................ 364/488, 489, 364/490, 578

[56] References Cited

U.S. PATENT DOCUMENTS

| | | | |
|---|---|---|---|
| 5,187,784 | 2/1993 | Rowson | 395/500 |
| 5,287,289 | 2/1994 | Kageyama et al. | 364/489 |
| 5,436,849 | 7/1995 | Drumm | 364/490 |
| 5,463,562 | 10/1995 | Theobald | 364/489 |
| 5,537,330 | 7/1996 | Damiano et al. | 364/489 |
| 5,537,580 | 7/1996 | Giomi et al. | 364/488 |

OTHER PUBLICATIONS

Dey et al., "Corolla Based Circuit Partitiioning And Resynthesis", *IEEE*, Paper 37.2, pp. 607–612, (1990).

De Micheli et al., "Design Systems For VLSI Circuits Logic Synthesis and Silicon Compilation", *Advanced Science Series*, No. 136, pp. 197–249, (1987).

*Primary Examiner*—Vincent N. Trans
*Attorney, Agent, or Firm*—Foley & Lardner

[57] ABSTRACT

A logic circuit partitioning system includes a logic circuit network generating portion for inputting a logical expression group and generating a logic circuit network, in which each node corresponds to each logical expression and each branch corresponds to a relationship between each logical expression, a matrix generating portion inputting the generated logical circuit network and generating a matrix, in which each row corresponds to the node in the logical circuit network and each column corresponds to an input of the logical circuit and node, and an arbitrary value is given for each element in the column corresponding to the input for the node corresponding to each row, a matrix partitioning portion for inputting the generated matrix and extracting a partial matrix which has sized in row and column greater than or equal to two and the arbitrary value at every elements therein from the matrix from the matrix generating portion, and a logic circuit network partitioning portion for partitioning partial circuit corresponding to the partial matrix extracted from the matrix, from the logic circuit network.

21 Claims, 14 Drawing Sheets

|   | a | b | c | x | y | z | w |
|---|---|---|---|---|---|---|---|
| x | 1 | 1 | 1 |   |   |   |   |
| y |   | 1 | 1 |   |   |   |   |
| z | 1 | 1 |   | 1 |   |   |   |
| w |   | 1 |   |   | 1 | 1 |   |

|          | a | b | c | x | y | z | w |
|----------|---|---|---|---|---|---|---|
| TFIN of x | 1 | 1 | 1 |   |   |   |   |
| TFIN of y |   | 1 | 1 |   |   |   |   |
| TFIN of z | 1 | 1 | 1 | 1 |   |   |   |
| TFIN of w | 1 | 1 | 1 | 1 | 1 | 1 |   |

5,764,527

OPTIMIZING METHOD FOR LOGIC CIRCUIT AND LOGIC CIRCUIT OPTIMIZING SYSTEM

BACKGROUND OF THE INVENTION

1. Field of the Invention

The present invention relates generally to an optimization of a logic circuit in a logic circuit designing process. More specifically, the invention relates to a logic circuit partitioning method for partitioning a logic circuit into a plurality of equivalent logic circuits, in particularly, into respective partial circuits having immediately common fan-in having strong consequence or transitive common fan-in for performing Boolean algebra process, such as minimization or simulation or synthesis of the logic circuit. The invention also relates to an optimization method for a logic circuit for minimizing the divided logic circuit, in particularly, for converting a logical expression group into another logical expression group representative of smaller circuit scale circuit.

2. Description of the Related Art

Nowadays, top-down designing of LSI employing high level descriptive language is frequently performed in designing the LSI. In a logic synthesis for designing of the LSI, optimization of a logic is performed in order to satisfy limitations of a circuit scale, delay and so forth. However, when a process employing Boolean algebra, such as minimization of the logic circuit and so forth on a computer, and when a scale of the logic circuit becomes large in certain extent, the necessary calculation period or a storage space required for calculation becomes huge to make it difficult to perform optimization process.

For example, it is assumed that there is a logical function f expressed by utilizing a logical function g:

$$f = a*b*g + c;$$

$$g = c + d + a$$

By replacing the logical function g in the logical function f, equalization of the logic expressed without utilizing the logic function g, then, following formulas are obtained.

$$f = a*b*(c*d+a)+c$$

$$f = a*b*c*d + a*b+c$$

When the process set forth above is processed on the computer, the equalization of the logical function having 100 parameters will require 99 powers of 2. In order to avoid increasing of the calculation period and the storage space required for calculation, it has been customary to divide into a portion that can be optimized by Boolean algebra process from the overall circuit. The Boolean algebra process is applied for respective of the divided circuit portions for reducing the calculation period and the storage space required for calculation.

Conventionally, a technology for performing partition of the logic circuit as set forth above, has been disclosed in "Corolla Based Circuit Partitioning and Resynthesis" (S. Dey, F. Brglez, G. Kedem, 27th ACM/IEEE DAC 1990, pp 607–615). In the foregoing publication, there is a discussion about a technology for partitioning the overall logic circuit into partial circuits paying attention to the portion having resynthesizing structure synthesized to another logical expression after passing a plurality of paths by a plurality of fan out from a predetermined logical expression.

FIG. 18A shows an example of a resynthesized logic circuit structure. In FIG. 18A, respective nodes p to t show individual logical expression and branches connected to respective nodes showing relation of connection of respective logical expression.

The logic circuit shown in FIG. 18A has a path reaching the node t from the node p via the node r and a path reaching the node s from the node p via the node q, paying attention to the path connecting the node p and the node t. Namely, the logic circuit resynthesizes from the node p to the node t via a plurality of paths. Accordingly, by partitioning the partial circuit from overall logic circuit, a logic optimizing process can be independently performed for such partial circuit. An example of the structure of the logic circuit resynthesized as a result of execution of the logic optimization for the partial circuit, is shown in FIG. 18B.

As set forth above, in the prior art, a part requiring resynthesizing structure shown in FIG. 18A is divided from the logic circuit, and with respect to each partial circuit, logic optimization is performed by Boolean algebra process with respect to each individual divided partial circuit.

Here, as a nature of a logical function, with respect to two partial circuits having almost no immediately common fan-in or common transitional fan-in, it is possible to independently perform Boolean algebra process. For example, a logical function f taking only a, b, c and a logical function g taking only d and e may reach the same result through processes either performing Boolean algebra process independently for respective logical functions or performing Boolean algebra process simultaneously as a single logic circuit. Accordingly, by performing logic optimization by partitioning the logic circuit into a plurality of partial circuits having the structure set forth above, it becomes possible to improve process efficiency. Here, the transitional fan-in does not mean a direct fan-in but a signal line via a node (logical expression) on the logical circuit.

However, in the conventional logic circuit partitioning method as set forth above, only partial circuits requiring resynthesis are divided. Partition of the logic circuit cannot be made for the partial circuit having almost no common fan-in with other circuit portion despite of the fact that Boolean algebra process can be performed independently even with respect to the partial circuits having almost no common fan-in with other circuit portion. This prevents improvement efficiency in logical optimization.

SUMMARY OF THE INVENTION

It is an object of the present invention to provide an optimization method for a logic circuit, in which partition of overall logic circuit into a plurality of partial circuits and a process efficiency in optimization of a logic can be improved.

According to the first aspect of the invention, a logic circuit partitioning system comprises:

logic circuit network generating means for inputting a logical expression group and generating a logic circuit network, in which each node corresponds to each logical expression and each branch corresponds to a relationship between each logical expression;

matrix generating means inputting the generated logical circuit network and generating a matrix, in which each row corresponds to the node in the logical circuit network and each column corresponds to an input of the logical circuit and node, and an arbitrary value is given for each element in the column corresponding to the input for the node corresponding to each row;

matrix partitioning means for inputting the generated matrix and extracting a partial matrix which has sized in row and column greater than or equal to two and the arbitrary value at every elements therein from the matrix from the matrix generating means; and logic circuit network partitioning means for partitioning partial circuit corresponding to the partial matrix extracted from the matrix, from the logic circuit network.

In the preferred construction, the logic circuit network partitioning means compares the matrix generated by the matrix generating means and the partial matrix extracted by the matrix partitioning means to detect mutually matching row, and the node on the logic circuit network corresponding to the matched row into the original logical expression group.

The logic circuit partitioning system may further comprise transitional fan-in matrix generating means for detecting row corresponding to the node having transitional fan-in in the logic circuit network, among matrix generated by the matrix generating means and generating a transitional fan-in matrix taking a transitional fan-in row obtained from a logical OR of the row and the row that transfers the transitional fan-in to the row in question as a row a element.

The matrix partitioning means extracts the partial matrix from the transitional fan-in matrix generated by the transitional fan-in matrix generating means in place of the matrix generated by the matrix generating means.

In such case, the transitional fan-in matrix partitioning means may repeat detection of the transitional fan-in with respect to one row within a range satisfying a predetermined constraint. Preferably, the predetermined constraint may be a maximum value of number of elements as a result of logical OR of the row corresponding the node having the transitional fan-in and the row corresponding to the node associated with the transitional fan-in, and the transitional fan-in matrix generating means repeats detection of the transitional fan-in within a range where the number of elements of the result of logical OR does not exceed the maximum value. In the alternative, the predetermined constraint may be a maximum value of the number of levels of the transitional fan-in, and the transitional fan-in matrix generating means repeats detection of the transitional fan-in within a range where the number of levels of the transitional fan-in does not exceed the maximum value.

The transitional fan-in matrix generating means may terminate detection of the transitional fan-in for the row in question when the transition fan-in of the row in question reaches the main fan-in of the logic circuit network.

According to the second aspect of the invention, a logic circuit partitioning method comprises the steps of:

inputting a logical expression group and generating a logic circuit network, in which each node corresponds to each logical expression and each branch corresponds to a relationship between each logical expression;

inputting the generated logical circuit network and generating a matrix, in which each row corresponds to the node in the logical circuit network and each column corresponds to an input of the logical circuit and node, and an arbitrary value is given for each element in the column corresponding to the input for the node corresponding to each row;

inputting the generated matrix and extracting a partial matrix which has sized in row and column greater than or equal to two and the arbitrary value at every elements therein from the matrix from the matrix generating step; and partitioning partial circuit corresponding to the partial matrix extracted from the matrix, from the logic circuit network.

According to the third aspect of the invention, a logic circuit optimizing system comprises:

logic circuit network generating means for inputting a logical expression group and generating a logic circuit network, in which each node corresponds to each logical expression and each branch corresponds to a relationship between each logical expression;

matrix generating means inputting the generated logical circuit network and generating a matrix, in which each row corresponds to the node in the logical circuit network and each column corresponds to an input of the logical circuit and node, and an arbitrary value is given for each element in the column corresponding to the input for the node corresponding to each row;

matrix partitioning means for inputting the generated matrix and extracting a partial matrix which has sized in row and column greater than or equal to two and the arbitrary value at every elements therein from the matrix from the matrix generating means;

logic circuit network partitioning means for partitioning partial circuit corresponding to the partial matrix extracted from the matrix, from the logic circuit network;

optimizing means for performing logic optimization process with respect to divided partial circuit;

logic circuit updating means for updating the logic circuit network by connecting the partial circuit for which logic optimization process has been effected, to the corresponding portion of the original logic circuit network; and logical expression outputting means for inputting the updated logic circuit network, converting the updated logic circuit network into the logical expression group and outputting the same.

The logic optimizing means may perform optimization of the logic circuit by executing at least a logic decomposition process.

According to the fourth aspect of the invention, a logic circuit optimizing method comprises the steps of:

inputting a logical expression group and generating a logic circuit network, in which each node corresponds to each logical expression and each branch corresponds to a relationship between each logical expression;

inputting the generated logical circuit network and generating a matrix, in which each row corresponds to the node in the logical circuit network and each column corresponds to an input of the logical circuit and node, and an arbitrary value is given for each element in the column corresponding to the input for the node corresponding to each row;

inputting the generated matrix and extracting a partial matrix which has sized in row and column greater than or equal to two and the arbitrary value at every elements therein from the matrix from the matrix generating step;

partitioning partial circuit corresponding to the partial matrix extracted from the matrix, from the logic circuit network;

performing logic optimization process with respect to divided partial circuit;

updating the logic circuit network by connecting the partial circuit for which logic optimization process has been effected, to the corresponding portion of the original logic circuit network; and inputting the updated logic circuit network, converting the updated logic circuit network into the logical expression group and outputting the same.

Other objects, features and effects of the present invention will become clear from the detailed description given hereinafter.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The preferred embodiments of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail for brevity.

Figure 1:
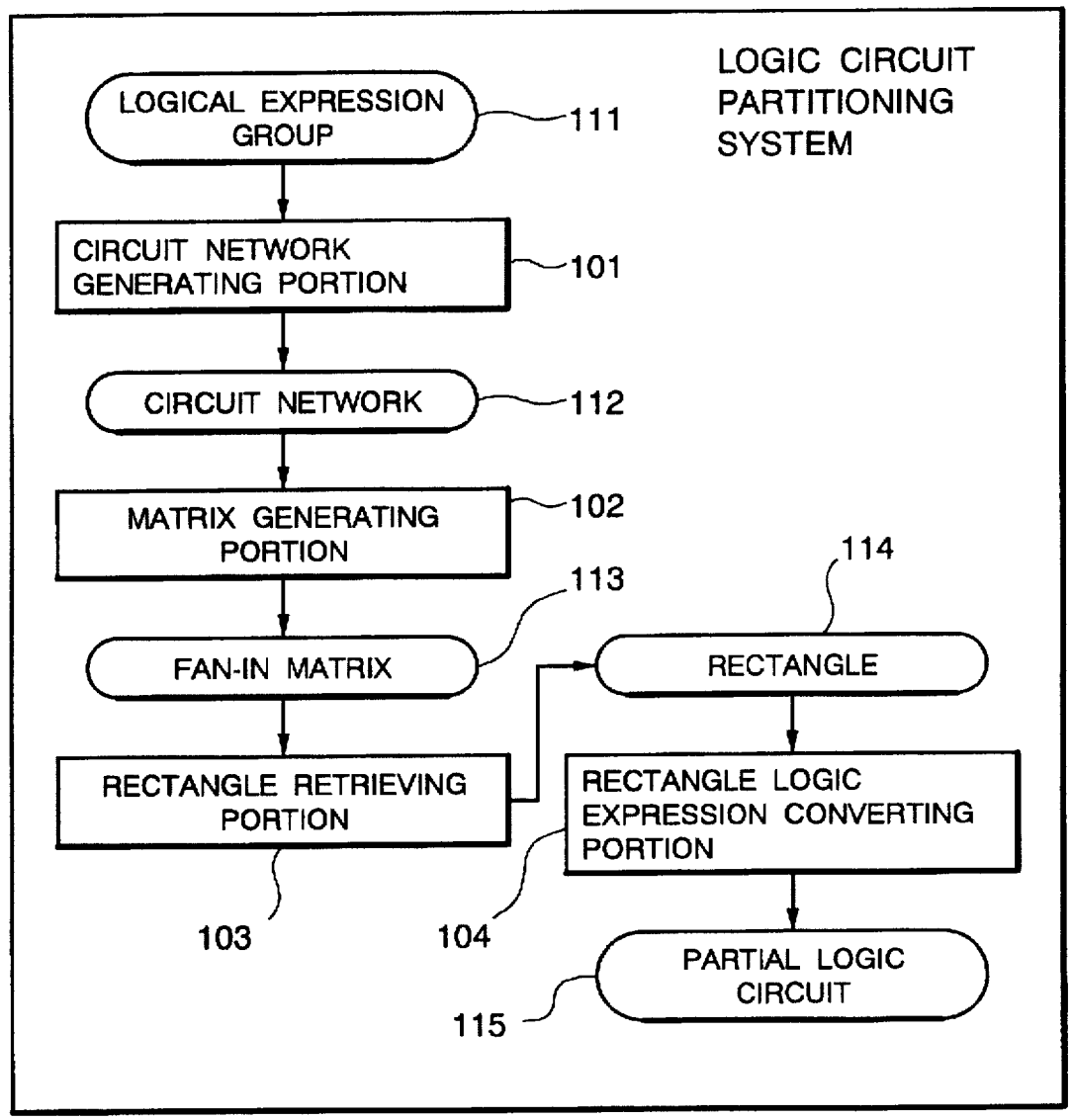
FIG. 1 is a block diagram showing a construction of the first embodiment of a logic circuit partitioning system according to the present invention.

FIG. 1 is a block diagram showing a construction of the first embodiment of a construction of a logic circuit partitioning system realizing the first embodiment of a logic circuit partitioning method according to the present invention.

The first embodiment of a logic circuit partitioning system according to the present invention includes a circuit network generating portion 101 for inputting a logical expression group and outputting the logical expression group, now converted, into a logic circuit network 112, a matrix generating portion 102 for inputting the output logic circuit network 112 and generating a fan-in 114 matrix, a rectangle retrieving portion 103 inputting the generated fan-in matrix and retrieving and extracting predetermined partial matrixes, and a rectangle logical expression converting portion 104 converting the extracted partial matrixes into a logical expression group. It should be noted that FIG. 1 shows only particular constructions in the shown embodiment, and other constructions are omitted. While not illustrated, various other components, such as storage means for storing the generated circuit network, matrixes and so forth, are provided, in practice.

The circuit network generating portion 101 is realized by a program controlled CPU and so forth. The circuit network generating portion 101 receives input of a logical expression group 111 and converts a logic circuit constructed with the logical expression group 111 into a circuit network 112. Then, the circuit network generating portion 101 outputs the converted circuit network 112. Namely, the circuit network generating portion 101 generates the circuit network 112 described by nodes representative of the logical expression and branches representative of input/output relationship, from the input logical expression group 111.

The matrix generating portion 102 is realized by a program controlled CPU and so forth. The matrix generating portion 102 makes respective nodes of the circuit network 112 generated by the circuit network generating portion 101, to correspond to a row, and all of the nodes of the circuit network 112 and all of the inputs to correspond to a column to establish a matrix. When the node of the circuit network 112 has an input, a value "1" is set as an arbitrary element at a position where the row corresponding to the node and a column corresponding to the input intersect. This process is performed with respect to all of the nodes to generate a fan-in matrix 113. The fan-in matrix 113 is indicative of input of each logical expression corresponding to each node. Each matrix element means that the logical expression corresponding to a certain node has a certain parameter. Among partial matrixes of the fan-in matrix, rectangular portions having sizes in both of row and column are two or more and all of the elements therein are "1" (this portion will be hereinafter referred to as "rectangle") representing that the nodes corresponding to respective row of the rectangle have nodes corresponding to respective columns as common fan-ins.

The rectangle retrieving portion 103 is realized by a program controlled CPU and so forth. The rectangle retrieving portion 103 retrieves the rectangle from the fan-in matrix 113 generated by the matrix generating portion 102. As a method for retrieving the rectangle, it may be possible to thoroughly retrieve all of the elements, or, in the alternative, to perform retrieval with employing an appropriate approximate methods. When a scale of the fan-in matrix is small, it may not cause significant degradation of the process efficiency even when thorough retrieval is performed for all of the elements. On the other hand, as the approximate methods, there are various known methods. An example of the approximate methods has been disclosed in "Algorithm for Multi-Level Logic Synthesis and Optimization" (R. K. Brayton, Design Systems for VLSI Circuits Logic Synthesis and Optimization, Martinus Nijhoff Publisher, pp 197–248). On the other hand, the rectangle as the object for retrieval, in case of partial matrixes having the same elements, the matrix having greater size in row and column may achieve higher efficiency in partitioning operation.

The rectangle logical expression converting portion 104 is realized by a program controlled CPU and so forth. With respect to a portion where the row of the retrieved rectangle and the row of the fan-in matrix are coincident, a rectangle/logic expression conversion is performed for converting the node of the circuit network corresponding to the retrieved rectangular portion into the corresponding logic expression. The logic expression thus obtained becomes the partial logic circuit having the common fan-in.

Next, as an example of the case where the following logic is input as a logic expression group, the operation of the logic circuit partitioning method will be discussed with reference to the flowchart in FIG. 2 and FIGS. 3 to 6.

For example, it is assumed that x, y z are logic expressions having the following parameters.

$x=a+b*c$ $y=b+c$ $z=a*x+b$ $w=z+b+y$

Figure 2:
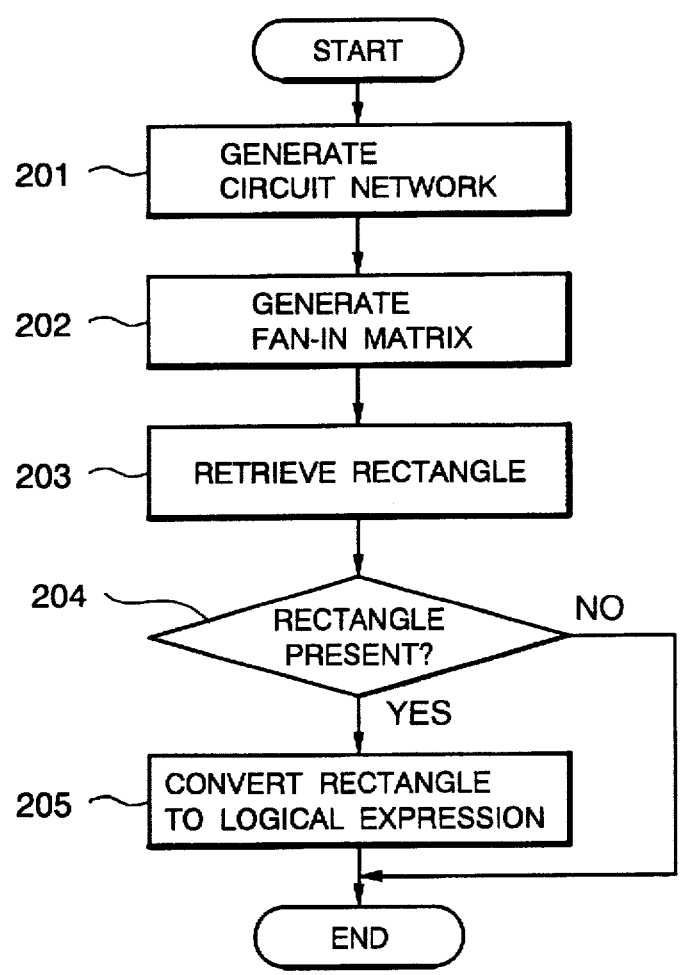
FIG. 2 is a flowchart showing operation of the first embodiment of the logic circuit partitioning system of FIG. 1.
Figures 3, 4:
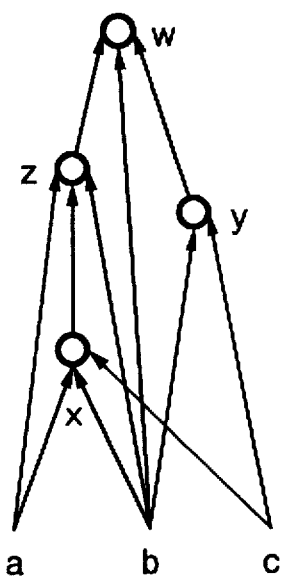
FIG. 3 is an illustration showing a construction of a logic circuit as an object for partition.
FIG. 4 is an illustration showing an example of a fan-in matrix.
Figure 5:
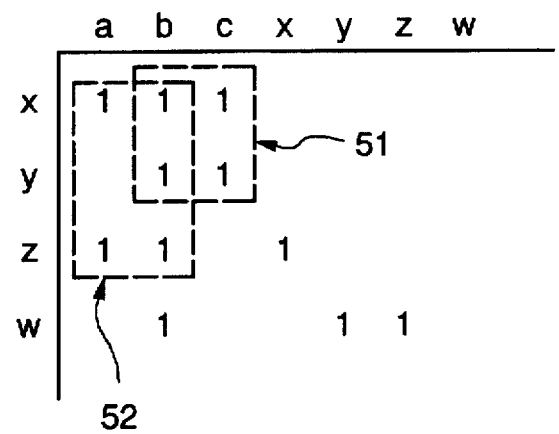
FIG. 5 is an illustration showing a process partitioning a logic circuit.

At first, the circuit network generating portion 101 converts the given logical expression 111 into the circuit network 112 (step 201). Namely, as shown in FIG. 2, by making all of the nodes in the circuit network 12 to correspond to the rows and by making all of the nodes in the circuit network 112 and the inputs to correspond to the columns, the matrix is generated. Value "1" is set at the matrix element at the position of the intersection of the row corresponding to each logical expression and the column corresponding to the input as the parameter of the relevant logical expression or the column corresponding to the node. For instance, the row x corresponding to the node x inputs a, b and c, values "1" are set at the intersection of the row x and the columns a, b and c respectively corresponding to inputs a, b and c. Also, since the row w corresponding to the node w is input b, y and x, the values "1" are set at the intersection of the row w and the columns b, y and z respectively corresponding to the input b and the nodes y and z.

Next, the rectangle retrieving portion 103 retrieves the rectangles 51 and 52 as the partial matrix having respectively two or more rows and columns and all of the elements therein being "1" (step 203). When no rectangle is present in the fan-in matrix 113, the partitioning process of the logic circuit by the shown embodiment is terminated (step 204).

It should be noted that, even in this case, the partitioning process of the partial circuits having the resynthesized structure and so forth by the conventional method may be executed irrespective of the shown embodiment.

Figure 6:
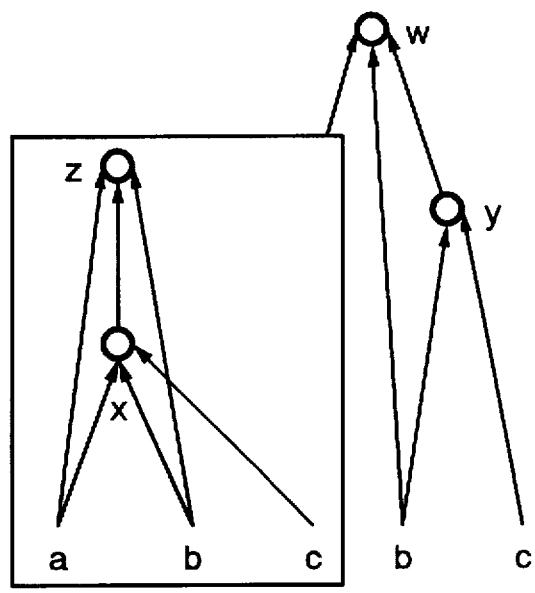
FIG. 6 is an illustration showing a condition of partition of the logic circuit.

Next, the rectangle logical expression converting portion 104 extracts node group of the codes x and z corresponding to the row of the retrieved rectangle 52. Then, as shown in FIG. 6, the circuit network constituted of the nodes x and z is divided from the original circuit network (step 205). Namely, the original circuit network is divided into the circuit expressed by:

$x=a+b*c$ $z=a*x+b$ and the circuit expressed by:

$y=b+c$ $w=z+b+y$

Figure 7:
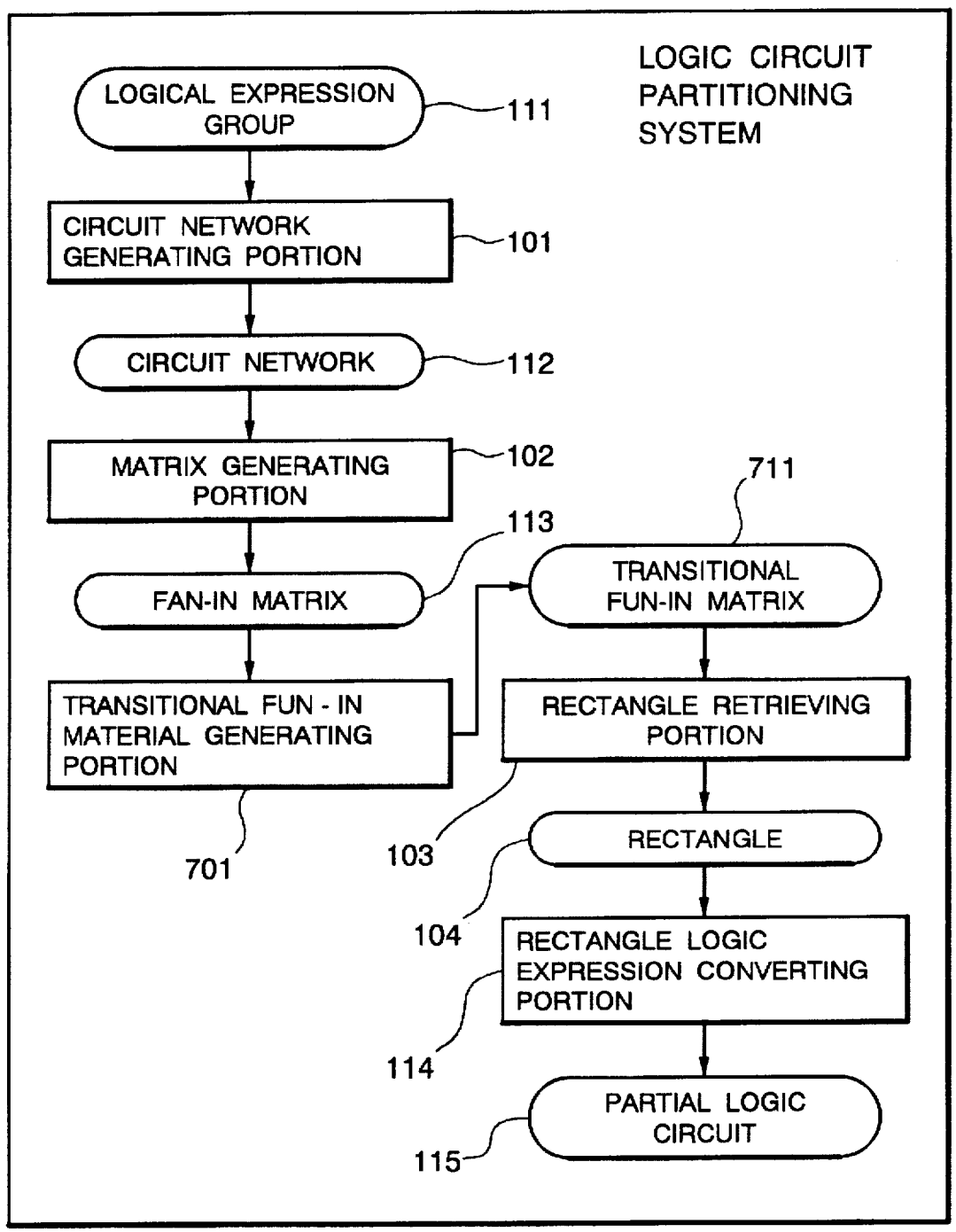
FIG. 7 is a block diagram showing a construction of the second embodiment of a logic circuit partitioning circuit according to the present invention.

FIG. 7 is a block diagram showing the second embodiment of a logic circuit partitioning system for realizing the second embodiment of the logic circuit partitioning method according to the present invention.

The shown embodiment of the logic circuit partitioning system divides the partial circuits having a common transitional fan-ins from the original logic circuit. As shown in FIG. 7, the second embodiment of a logic circuit partitioning system according to the present invention includes a circuit network generating portion 101 for inputting a logical expression group and outputting the logical expression group with converting into a logic circuit network, a matrix generating portion 102 for inputting the output logic circuit network and generating a fan-in matrix, a transitional fan-in matrix generating portion 701 for generating rows representative of the transitional fan-ins on the basis of the generated fan-in matrix (hereinafter referred to as "transitional fan-in row") and a new matrix taking the transitional fan-in rows as row elements (hereinafter referred to as "transitional fan-in matrix"), a rectangle retrieving portion 103 inputting the generated fan-in matrix and retrieving and extracting predetermined partial matrixes, and a rectangle logical expression converting portion 104 converting the extracted partial matrixes into a logical expression group. Among the construction set forth above, the circuit network generating portion 101, the matrix generating portion 102, the rectangle retrieving portion 103 and the rectangle logical expression converting portion 104 are the same as those in the first embodiment of FIG. 1, and thus represented by the same reference numerals and detailed description thereof is omitted for brevity. It should be noted that FIG. 7 shows only particular constructions in the shown embodiment, and other constructions are omitted. While not illustrated, various other components, such as storage means for storing the generated circuit network, matrixes and so forth, are provided, in practice.

The transitional fan-in matrix generating portion 701 is realized by a program controlled CPU and so forth. Transitional fan-in matrix generating portion 701 detects rows in the fan-in matrix corresponding to the nodes having the transition fan-in under a predetermined constraint condition and generates the transitional fan-in matrix 211 taking the transitional fan-in rows as row elements by performing calculation of logical OR.

Here, the elements of the fan-in matrix represents that the node of the circuit network corresponding to the certain row has the node corresponding to the column components of the relevant row at the input. Also, the result of logical OR calculation of two rows in the fan-in matrix represents a sum set of inputs of two logical expression corresponding to two rows. With taking these two natures, with respect to the node corresponding to the predetermined row in the fan-in matrix, not only the direct input but also the transitional fan-ins input indirectly via other node are detected to obtain the logical sum of the node corresponding to the given row and the transitional fan-in of the row in question and generates the transitional fan-in matrix taking the transitional fan-in rows as row elements.

Figure 8:
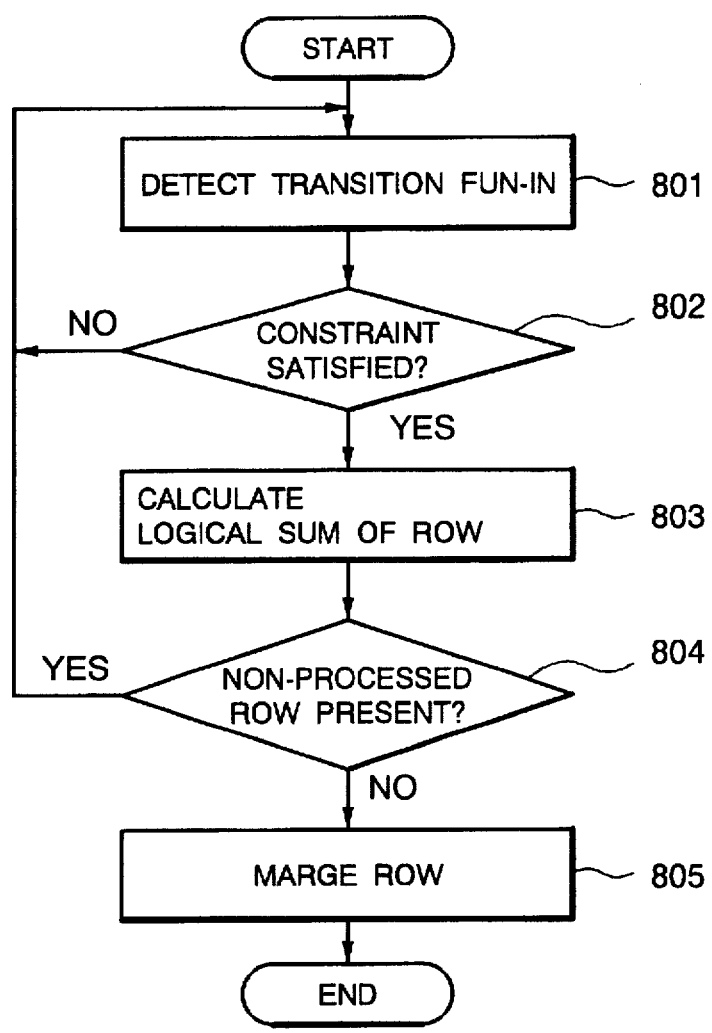
FIG. 8 is a flowchart showing operation of a transitional fan-in matrix generating portion of the second embodiment of a logic circuit partitioning circuit.
Figure 9:
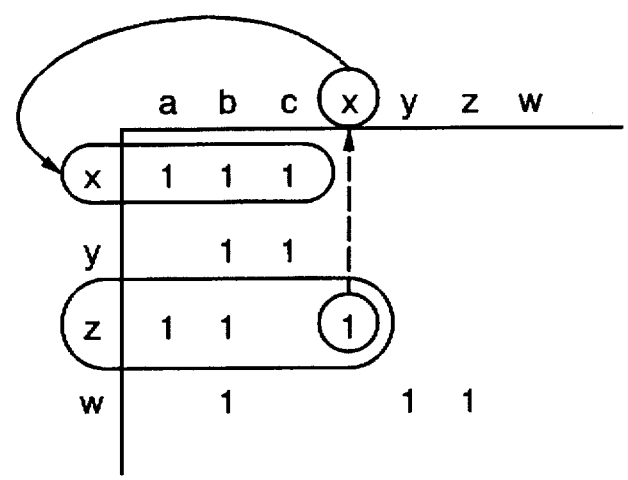
FIG. 9 is an illustration showing a process for generating a transitional fan-in matrix.

With reference to a flowchart in FIG. 8 and further with reference to FIGS. 9 to 11, the operation of the transitional fan-in matrix generating portion 701 will be discussed in detail. FIG. 9 shows a fan-in matrix generated with respect to the logical expressions:

$$x=a+b*c$$

$$y=b+c$$

$$z=a*x+b$$

$$w=z+b+y$$

Figure 10:
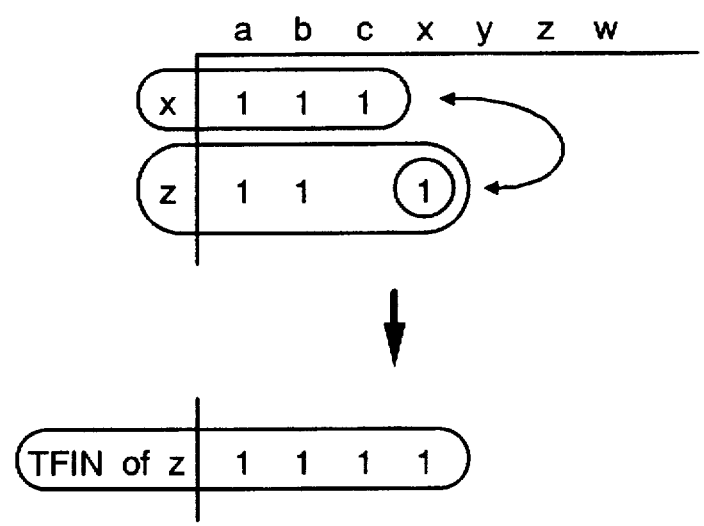
FIG. 10 is an illustration showing a process for generating a transitional fan-in matrix.
Figures 11, 14:
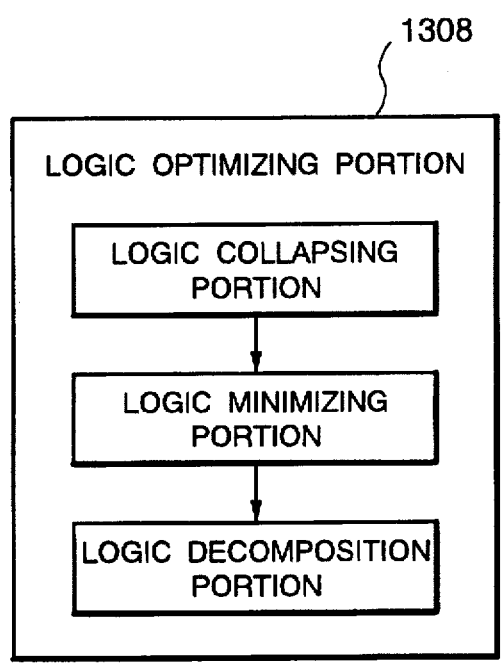
FIG. 11 is an illustration showing a condition, in which a transitional fan-in matrix is generated.
FIG. 14 is a block diagram showing a construction of the third embodiment of the logic circuit optimizing portion.

FIGS. 10 and 11 are illustration showing processes for generating the transitional fan-in matrix from the fan-in matrix. In the shown example, the node x has inputs a, b and c, the node z has inputs a and b and node x as inputs.

At first, by inputting the fan-in matrix 113 generated by the matrix generating portion 102, nodes having the column component of the element of the row corresponding to the given node of the circuit network 112 become the input of other node (step 801). Namely, the node having the first level transition fan-in is detected. The nodes having transitional fan-ins having the second or subsequent levels may also be detected by repeating the similar process.

Here, as shown in FIG. 9, the element of the row z contains column elements a, b and x. Therefore, the fact that the node x is the first level transitional fan-in of the node z can be detected. On the other hand, since the row of the fan-in matrix of the node x contains the column elements a, b and c, the fact that the a, b and c are second level transitional fan-in of the node z.

On the other hand, so as not to make the partial circuit excessively large by excessively large number of levels of transitional fan-ins, limitation is given for the number of elements of the results of logical OR or the number of levels of the transitional fan-ins (step 802). Namely, by counting the number of levels of calculation of the logical OR of the matrix as maximum number of the number of the intermediate nodes in the transitional fan-in (number of level of the transitional fan-in) and number of transitional fan-ins corresponding to the relevant row, check is performed whether the number of levels and the number of transitional fan-ins exceed predetermined limit or not.

When the number of levels and the number of transitional fan-ins exceed the limits, calculation of logical OR of the row is performed (step 803). If the number of levels and the number of transitional fan-ins do not exceed the limits, detection of transitional fan-in is again performed at the step 801 to retrieve the transitional fan-in at the greater level. On the other hand, when the transitional fan-in reaches the main input of the circuit, the process is advanced to calculate of the logical OR of the row at the step 803 since no further greater level of transitional fan-in is available. In the shown example, the second level transitional fan-ins of the node z are a, b and c, which are the main inputs of the logic circuit. Therefore, with respect to the row z, detection of the transitional fan-in is terminated and the process is advanced to the step of calculation of the logical OR of the row x and row z.

In the calculation of the logical OR of the row, calculation of the logical OR of the rows corresponding to all of the detected transitional fan-ins and the rows corresponding to the nodes having the transitional fan-ins is performed to establish a new row. The new row represents the transitional fan-ins of the relevant node. In the shown example, TFIN of z is the newly generated row of the transitional fan-ins corresponding to the node z.

It should be noted that the foregoing detection of the transitional fan-in and calculation of the logical OR of the row is performed with respect to all of the rows in the fan-in matrix. Subsequently, by row marge, generated new rows are aggregated to establish the transitional fan-in matrix (step 805). The transitional fan-in matrix generated by the foregoing process with respect to the fan-in matrix shown in FIG. 9 is the matrix shown in FIG. 11.

Figure 12:
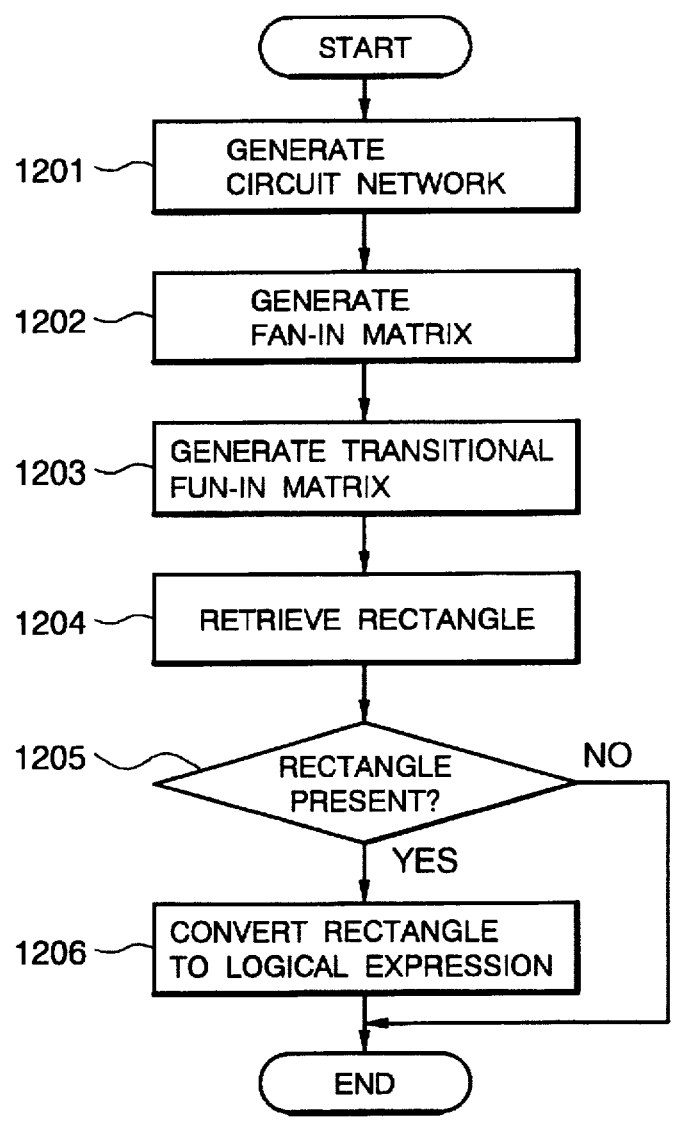
FIG. 12 is a flowchart showing the operation of the second embodiment of the logic circuit partitioning system.

FIG. 12 is a flowchart showing the operation of the second embodiment of the logic circuit partitioning system.

As shown in FIG. 12, the operations of generation of the circuit network and generation of the fan-in matrix are the same as those in the first embodiment as illustrated in FIG. 2 (steps 1201 and 1202). Then, in the manner set forth above, the transition fan-in matrix is generated (step 1203). Subsequently, similarly to the foregoing first embodiment illustrated in FIG. 2, the rectangle is retrieved and conversion of the logical expression is performed (steps 1204, 1205 and 1206).

As set forth above, with employing the logic circuit partitioning system according to the present invention, the divided circuits are the partial circuits having common fan-ins and have no or few common fan-ins with other partial circuits divided the partial circuit in question. Therefore, when optimization of the logic or simulation is performer with respect to such partial circuit, the process can be performed independently of other circuits. Accordingly, by adding the logic circuit partitioning process of the present invention to the conventionally performed logic circuit partitioning process, the process efficiency of logic optimization can be improved.

Next, discussion will be given for an embodiment of a logic circuit optimization method utilizing the logic circuit partitioning system according to the present invention.

Figure 13:
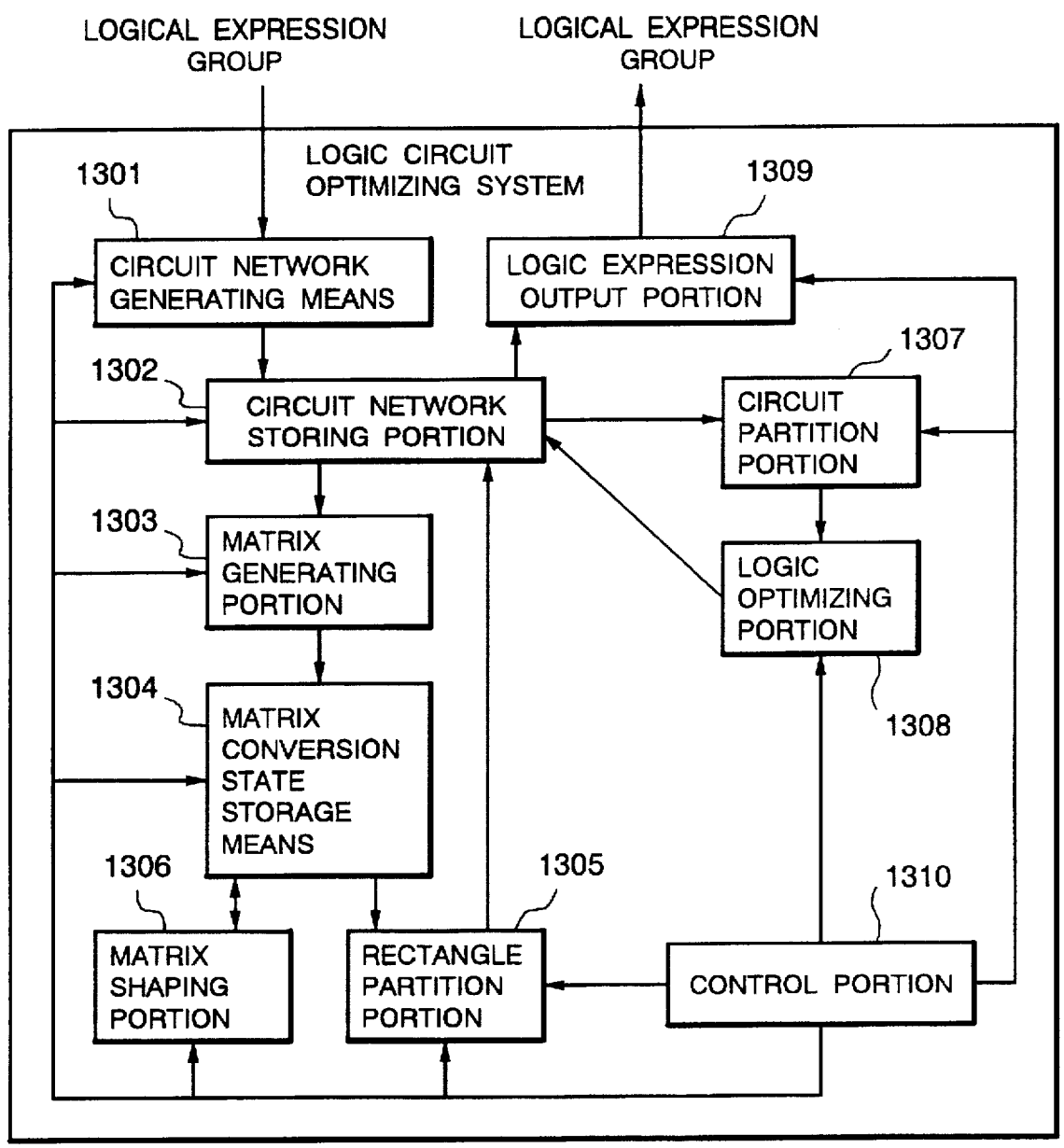
FIG. 13 is a block diagram showing the third embodiment a logic circuit optimizing system according to the present invention.

FIG. 13 is a block diagram showing a construction of the third embodiment of the logic circuit optimization system for realizing the third embodiment of the logic circuit optimization method according to the present invention.

As shown in FIG. 13, the shown embodiment of the logic circuit optimization system includes a circuit network generating portion 1301 for inputting the logic expression group and converting the input logic expression group into a logic circuit network for outputting the same, a circuit network status storage portion 1302 for storing the logic circuit network output from the circuit network generating portion 1301, a matrix generating portion 1303 for reading out the logic circuit network stored in the circuit network status storage portion 1302 and generating a fan-in matrix, a matrix modification state storage portion 1304 for storing the fan-in matrix generated by the matrix generating portion 1303, a rectangle partitioning portion 1305 and a matrix shaping portion 1306 for reading out the fan-in matrix from the matrix modification state storage portion 1304, retrieving a predetermined partial matrix in the fan-in matrix and dividing the fan-in matrix, a circuit partitioning portion 1307 for partitioning the logic circuit network read out from the circuit network status storage portion 1302 on the basis of the divided fan-in matrix, a logic optimizing portion 1308 for performing logic optimization with respect to the divided partial circuit, a logical expression outputting portion 1309 for converting the optimized logic circuit into a logic expression group and outputting the same, and a control portion 1310 for controlling respective portions set forth above. It should be noted that FIG. 13 shows only particular constructions in the shown embodiment, and other constructions are omitted. While not illustrated, various other components, such as an interface for inputting and outputting the logical expression group, and so forth.

The circuit network generating portion 1301 is similar to the circuit network generating portion 101 in the first and second embodiment, and thus generates a logic circuit network by inputting the logical expression. The logic circuit network generated by the circuit network generating portion 1301 is stored in the circuit network status storage portion 1302, which may be realized by a memory device.

The matrix generating portion 1303 is similar to the rectangle retrieving portion 103 in the foregoing first and second embodiment. The matrix generating portion 1303 receives the logic circuit network from the circuit network status storage portion 1302 as input and generates the fan-in matrix. The fan-in matrix generated by the matrix generating portion 1303 is stored in the matrix modification state storage portion 1304, which is also realized by a memory device.

The rectangle partitioning portion 1305 and the matrix shaping portion 1306 correspond to the rectangle retrieving portion 103 of the foregoing first and second embodiments. The rectangle partitioning portion 1305 is realized by a program controlled CPU and so forth. The rectangle partitioning portion 1305 reads out the fan-in matrix from the matrix modification state storage portion 1304 and extracts the rectangular portion from the original fan-in matrix according to a given rule. The extracted rectangular portion forms the partial matrix of the original fan-in matrix, which has the sizes of the row and column of two or more and, in which all of the elements have the value "1". The rectangle represents that the nodes corresponding to respective row in the rectangular portion have nodes in respective columns as common fan-ins.

The matrix shaping portion 1306 is realized by a program controlled CPU and so forth. The matrix shaping portion 1306 removes the rectangular portion which is extracted by the rectangle partitioning portion 1305 from the fan-in matrix stored in the matrix modification state storage portion 1304. By this, the fan-in matrix is divided into the rectangular portion to provide the maximization and the remaining partial matrix from which the rectangular position is removed.

The circuit partitioning portion 1307 is realized by a program controlled CPU and so forth. The circuit partitioning portion 1307 reads out the logic circuit network from the circuit network status storage portion 1302 and divides the logical circuit network on the basis of the partial matrixes divided by the rectangle partitioning portion 1305 and the matrix shaping portion 1306. Namely, the circuit partitioning portion 1307 divides the rectangular portion determined by the rectangle partitioning portion 1305 from the logic circuit network.

The logic optimizing portion 1308 is realized by a program controlled CPU and so forth. The logic optimizing portion 1308 performs optimization with respect to the rectangular portion divided from the fan-in matrix. FIG. 14 shows one example of construction of the logic optimizing portion 1308. As methods for logic optimization, conventionally known methods, such as decomposition, logic minimization, logic collapsing, network optimization and so forth may be employed. An embodiment for optimization will be discussed later. On the other hand, the logic optimizing portion 1308 updates the content of the circuit network status storage portion 1302 by inserting the optimized partial matrix to the position where the corresponding partial circuit is divided from the original logic circuit.

The logical expression outputting portion 1309 is realized by a program controlled CPU and so forth. The logical expression outputting portion 1309 converts the logic circuit, in that all of the portions which can be optimized are optimized into a logic expression group.

Figure 15:
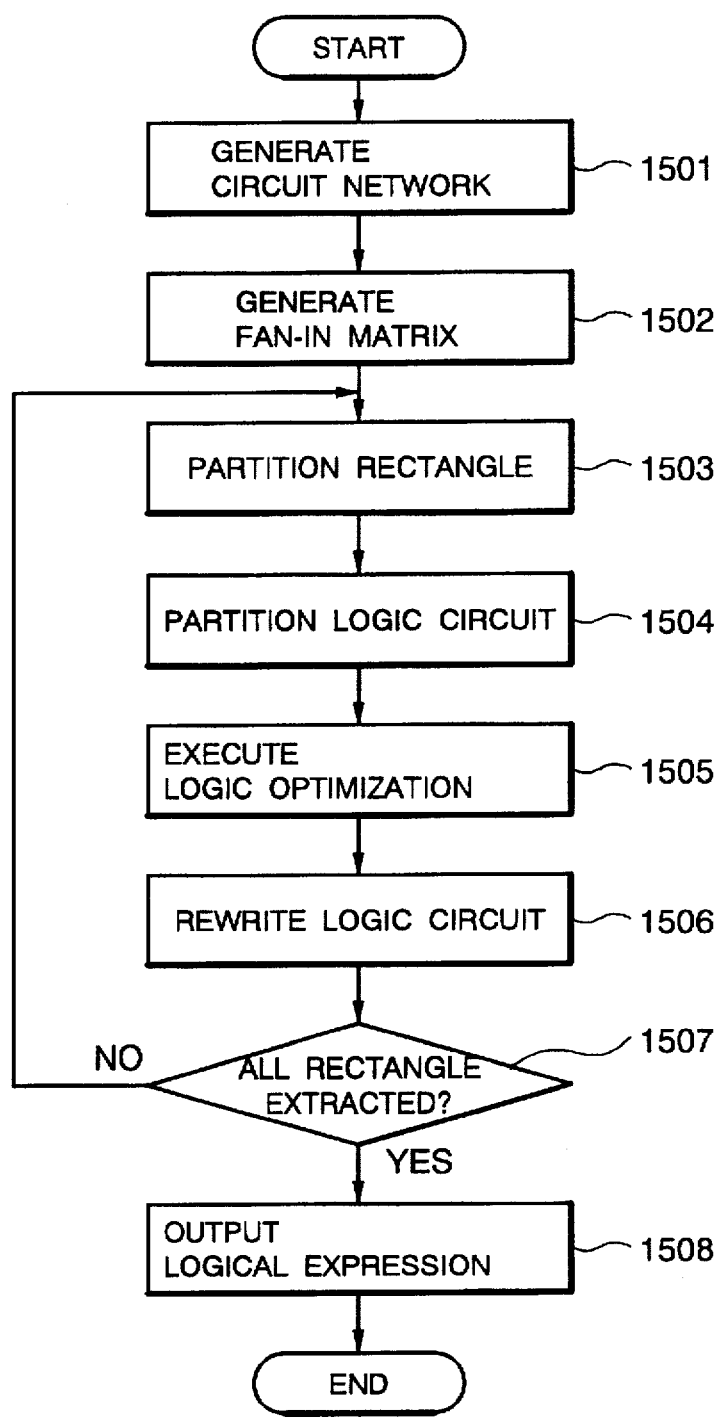
FIG. 15 is a flowchart showing operation of the third embodiment of the logic circuit optimizing portion.

FIG. 15 is a flowchart showing the operation by the second embodiment of logic circuit optimization method.

As shown in FIG. 15, the circuit network is generated. The operation for generating the fan-in matrix is similar to the operation of the first embodiment (steps 1501 and 15002).

Next, the rectangle partitioning portion 1305 and the matrix shaping portion 1306 divides the rectangular portions from the fan-in matrix (step 1503). Then, the circuit partitioning portion 1307 divides the logic circuit on the basis of the divided fan-in matrix (step 1504).

Subsequently, the logic optimizing portion 1308 performs optimization for the divided partial matrix divided from the fan-in matrix (step 1505). Here, as a manner for logic optimization, the logic multi-levels may be applicable for the shown embodiment. For example: the logical expression of $$f=a*b+a*c$$

is converted as:

$$f=a* (b+c)$$

to aggregate the common fan-in. Therefore, employment of the logic multi-level method may be used for higher efficiency.

Next, the control portion 1310 inspects respective partial circuits before and after logic optimization. When the partial circuit after optimization satisfies the predetermined constraint condition, the control portion 1310 connects the optimized partial circuit and re-write the content of the circuit network status storage portion 1302.

Until all of the rectangular portions are extracted from the fan-in matrix, the steps 1503 to 1506 are repeated (step 1507). After logic optimization with extracting all of the rectangular portions, the logic expression converts the logic circuit after optimization stored in the circuit network status storage portion 1302 and outputs portion output the converted logical expression group (step 1508).

Thereafter, the control portion 1310 may repeat the logic optimization of the logic circuit of the relevant logic expression group.

With the shown embodiment, in case of the circuit employing a several ten thousands of transistors, it becomes possible to divide into partial matrixes generally having several hundreds. Comparing the logic optimization of the entire circuit in the scale of ten thousands and the optimization of respective divided individual circuits, assuming that the calculation period is proportional to the square of the circuit size, the calculation period for the divided circuit becomes approximately one ten thousand. Therefore, the overall processing speed becomes shortened to about one hundredth.

Figure 16:
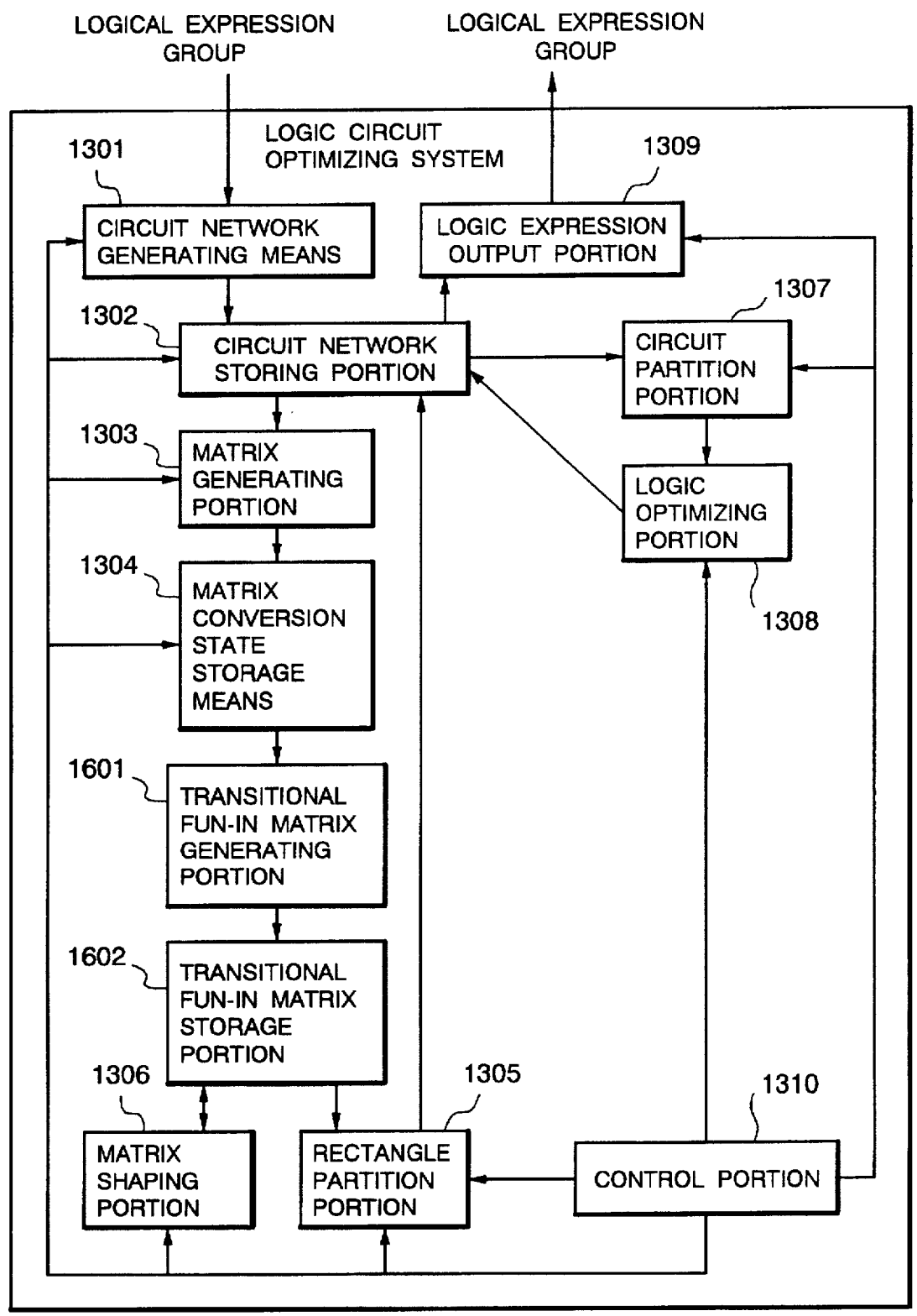
FIG. 16 is a block diagram showing the fourth embodiment of a logic circuit optimizing system according to the present invention.

FIG. 16 is a block diagram showing a construction of the third embodiment of the logic circuit optimization system for realizing the third embodiment of the logic circuit optimization method according to the present invention.

As shown in FIG. 13, the shown embodiment of the logic circuit optimization system includes a circuit network generating portion 1301 for inputting the logic expression group and converting the input logic expression group into a logic circuit network for outputting the same, a circuit network status storage portion 1302 for storing the logic circuit network output from the circuit network generating portion 1301, a matrix generating portion 1303 for reading out the logic circuit network stored in the circuit network status storage portion 1302 and generates a fan-in matrix, a matrix modification state storage portion 1304 for storing the fan-in matrix generated by the matrix generating portion 1303, a transitional fan-in matrix generating portion 1601 for reading the fan-in matrix from the matrix modification state storage portion 1304 and generating a transitional fan-in matrix, a transitional fan-in matrix storage portion 1602 for storing the transitional fan-in matrix generated by the transitional fan-in matrix generating portion 1601, a rectangle partitioning portion 1305 and a matrix shaping portion 1306 for reading out the fan-in matrix from the matrix modification state storage portion 1304, retrieving a predetermined partial matrix in the fan-in matrix and dividing the fan-in matrix, a circuit partitioning portion 1307 for partitioning the logic circuit network read out from the circuit network status storage portion 1302 on the basis of the divided fan-in matrix, a logic optimizing portion 1308 for performing logic optimization with respect to the divided partial circuit, a logical expression outputting portion 1309 for converting the optimized logic circuit into a logic expression group and outputting the same, and a control portion 1310 for controlling respective portions set forth above. It should be noted that FIG. 13 shows only particular constructions in the shown embodiment, and other constructions are omitted. While not illustrated, various other components, such as an interface for inputting and outputting the logical expression group, and so forth.

The transitional fan-in matrix generating portion 1601 is similar to the transitional fan-in matrix generating portion 701 in the second embodiment. Under a given limitations, transitional fan-in matrix generating portion 1601 detects rows in the fan-in matrix corresponding to the nodes having transition fan-in under a predetermined constraint condition and generates the transitional fan-in matrix taking the transitional fan-in rows as row elements by performing calculation of logical OR. The transitional fan-in matrix generated as set forth above is stored in the transitional fan-in matrix storage portion 1602, which may comprise a memory means.

The rectangle partitioning portion 1305 extracts the rectangular portion from the transitional fan-in matrix stored in the transitional fan-in matrix storing means, and the matrix shaping portion 1306 removes the relevant portion corresponding to the extracted rectangular portion.

Figure 17:
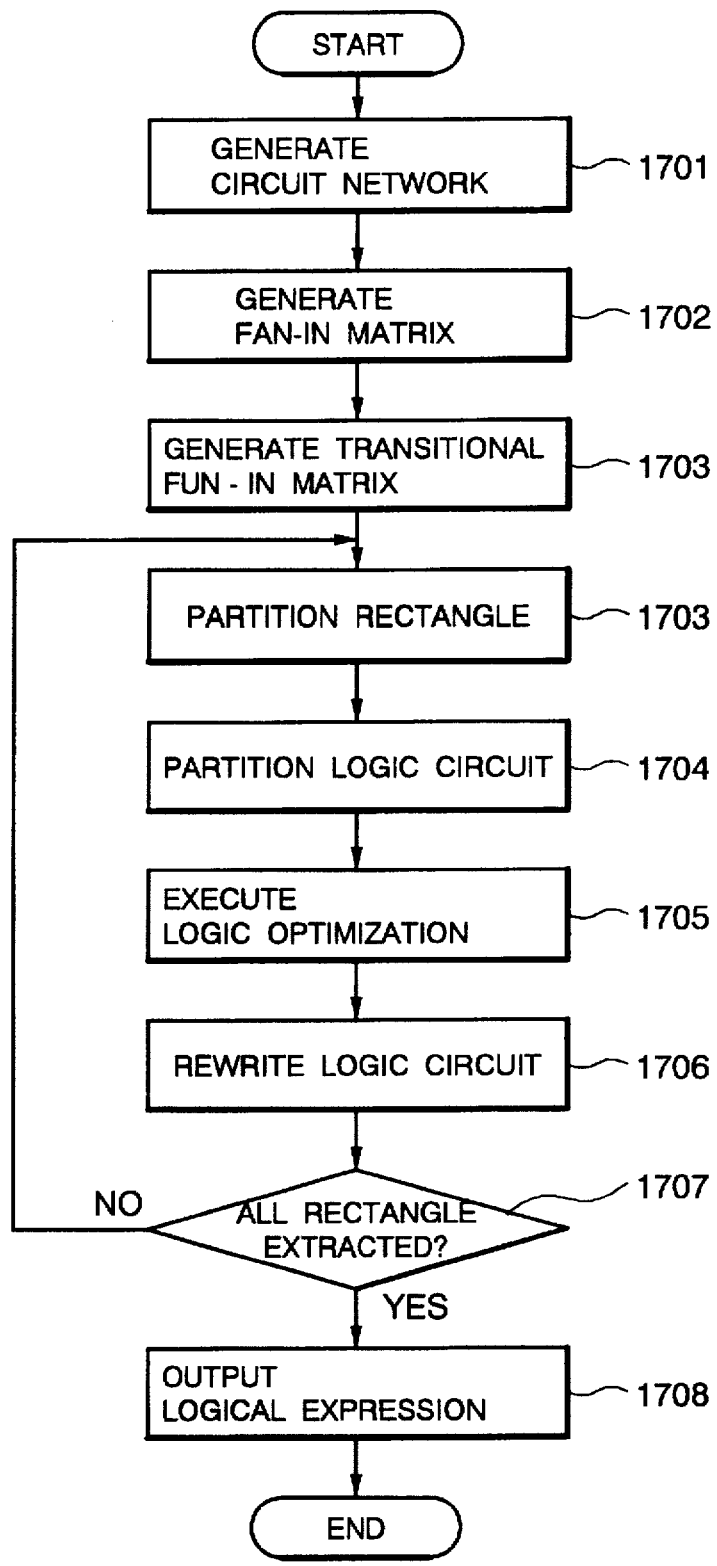
FIG. 17 is a flowchart showing operation of the fourth embodiment of the logic color optimizing system.
Figure 18A:
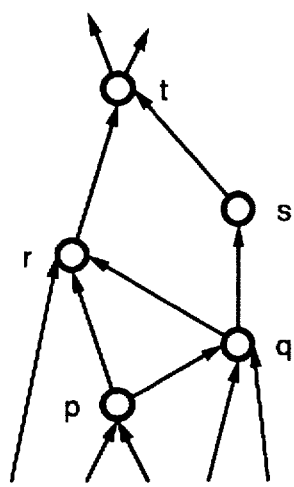
FIG. 18A is an illustration showing an example of construction of a optimized logic circuit optimized by the conventional logic optimizing system.
Figure 18B:
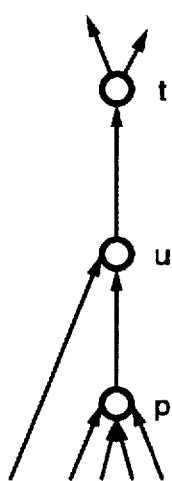
FIG. 18B is an illustration showing an example of construction of the optimized logic circuit optimized by the conventional logic optimizing system.

FIG. 17 is a flowchart showing the operation of the fourth embodiment of a logic circuit optimization method.

As shown in FIG. 17, the circuit network is generated. The operation for generating the fan-in matrix is the same of that of the third embodiment (steps 1701 and 1702). Then, the transitional fan-in matrix is generated in the similar manner to that of the second embodiment of the logic circuit partitioning method (step 1703).

Next, the rectangle partitioning portion 1305 and the matrix shaping portion 1306 divides the rectangular portion from the transitional fan-in matrix (step 1704). Then, the circuit partitioning portion 1307 divides the logic circuit (step 1705)

Then, the logic optimizing portion 1308 performs optimization for the partial circuit divided from the original logic circuit (step 1706). Here, a logic collapsing, the logic minimization and the logic decomposition may be applied as the method for performing optimization. For example, in the logic expression:

$$f=a*b+\bar{a}*c$$

when $$c=a*b*d$$

by performing logic collapsing:

$$f=\bar{a}*b+a*\overline{a*b}*d$$

$$f=\bar{a}*b+a*\bar{a}+a*\bar{b}+a*\bar{d}$$

Then, by performing two level logic minimization method to establish:

$$f=a*\bar{b}+a*\bar{d}+\bar{a}*e$$

Then, by performing logic decomposition to obtain:

$$f=a*(\bar{b}+\bar{d})+\bar{a}*e$$

Subsequently, by the similar operation to the third embodiment shown in FIG. 15, the logic circuit is converted into the logical expression group and then output (steps 1707, 1708, 1709).

As set forth above, with the shown embodiment, the redundant portions of the circuit are removed by logic collapsing and logic minimization, and then the circuit is decomposed by the logic decomposition to achieve optimization. By this, the circuit containing several tens thousands of transistors can be divided into partial circuits containing several thousands of transistors. Therefore, in comparison with application of the logic collapsing for the overall circuit, effective process speed becomes several thousands times higher.

As set forth above, the present invention can divide the portion of the logic circuit having a common fan-in, which partial circuit has no or few common fan-ins with other portion of the circuits other than the partial circuit divided therefrom, in addition to partition by the conventionally performed logic circuit partition process by performing partition with expression by the matrix after conversion of the logical expression group into the logic circuit. Then, with respect to such portions, optimization of the logic, simulation can be performed to make process speed in logic optimization remarkably higher, and thus can significantly improve efficiency.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments that can be embodied within a scope encompassed and equivalents thereof with respect to the feature set out in the appended claims.

What is claimed is:

1. A logic circuit partitioning system comprising:

logic circuit network generating means for inputting a logical expression group comprising one or more logical expressions and generating a logic circuit network having one or more nodes and branches, wherein each node corresponds to each logical expression and each branch corresponds to a relationship between each logical expression;

matrix generating means for inputting the generated logical circuit network and generating a matrix comprising rows and columns, wherein each row corresponds to the node in said logical circuit network and each column corresponds to an input of said logical circuit and node, and an arbitrary value is given for each element in the column corresponding to the input for the node corresponding to each row;

matrix partitioning means for inputting the generated matrix and extracting a partial matrix containing at least two rows and columns with the arbitrary value at every elements therein from said matrix generated from said matrix generating means; and logic circuit network partitioning means for partitioning a partial circuit corresponding to said partial matrix extracted from said matrix, from said logic circuit network.

2. A logic circuit partitioning system as set forth in claim 1, wherein said logic circuit network partitioning means compares the matrix generated by said matrix generating means and the partial matrix extracted by said matrix partitioning means to detect mutually matching row, and the node on said logic circuit network corresponding to the matched row into the logical expression group.

3. A logic circuit partitioning system as set forth in claim 1, which further comprises transitional fan-in matrix generating means for detecting a row corresponding to the node having a transitional fan-in in said logic circuit network, among the matrix generated by said matrix generating means and generating a transitional fan-in matrix taking a transitional fan-in row obtained from a logical OR of said row and the row which transfers the transitional fan-in to said row in question as a row element, and wherein said matrix partitioning means extracts said partial matrix from said transitional fan-in matrix generated by said transitional fan-in matrix generating means in place of the matrix generated by said matrix generating means.

4. A logic circuit partitioning system as set forth in claim 3, wherein said transitional fan-in matrix partitioning means repeats detection of said transitional fan-in with respect to one row within a range satisfying a predetermined constraint.

5. A logic circuit partitioning system as set forth in claim 4, wherein said predetermined constraint is a maximum value of number of elements as a result of logical OR of the row corresponding the node having said transitional fan-in and the row corresponding to the node associated with said transitional fan-in, and said transitional fan-in matrix generating means repeats detection of said transitional fan-in within a range where said number of elements of the result of logical OR does not exceed said maximum value.

6. A logic circuit partitioning system as set forth in claim 4, wherein said predetermined constraint is a maximum value of the number of levels of said transitional fan-in, and said transitional fan-in matrix generating means repeats detection of said transitional fan-in within a range where the number of levels of said transitional fan-in does not exceed said maximum value.

7. A logic circuit partitioning system as set forth in claim 4, wherein said transitional fan-in matrix generating means terminates detection of the transitional fan-in for the row in question when the transition fan-in of the row in question reaches the main input of the logic circuit network.

8. A logic circuit partitioning method comprising the steps of:

inputting a logical expression group comprising one or more logical expressions and generating a logic circuit network having one or more nodes and branches, wherein each node corresponds to each logical expression and each branch corresponds to a relationship between each logical expression;

inputting the generated logical circuit network and generating a matrix comprising rows and columns, wherein each row corresponds to the node in said logical circuit network and each column corresponds to an input of said logical circuit and node, and an arbitrary value is given for each element in the column corresponding to the input for the node corresponding to each row;

inputting the generated matrix and extracting a partial matrix containing at least two rows and columns with the arbitrary value at every elements therein from said matrix generated from said matrix generating step; and partitioning a partial circuit corresponding to said partial matrix extracted from said matrix, from said logic circuit network.

9. A logic circuit partitioning method as set forth in claim 8, which further comprises a step of detecting a row corresponding to the node having a transitional fan-in in said logic circuit network, among the matrix generated by said matrix generating means and generating a transitional fan-in matrix taking a transitional fan-in row obtained from a logical OR of said row and the row which transfers the transitional fan-in to said row in question as a row element, and wherein said step of extracting said partial matrix extracts the partial matrix from said transitional fan-in matrix generated by said transitional fan-in matrix generating step in place of the matrix generated by said matrix generating step.

10. A logic circuit partitioning method as set forth in claim 9, wherein said transitional fan-in matrix partitioning step is repeated for detection of said transitional fan-in with respect to one row within a range satisfying a predetermined constraint.

11. A logic circuit partitioning method as set forth in claim 10, wherein said predetermined constraint is a maximum value of number of elements as a result of logical OR of the row corresponding the node having said transitional fan-in and the row corresponding to the node associated with said transitional fan-in, and said transitional fan-in matrix generating step is repeated for detection of said transitional fan-in within a range where said number of elements of the result of logical OR does not exceed said maximum value.

12. A logic circuit partitioning method as set forth in claim 10, wherein said predetermined constraint is a maximum value of the number of levels of said transitional fan-in, and said transitional fan-in matrix generating means repeats detection of said transitional fan-in within a range where the number of levels of said transitional fan-in does not exceed said maximum value.

13. A logic circuit partitioning method as set forth in claim 10, wherein said transitional fan-in matrix generating step is terminated detection of the transitional fan-in for the row in question when the transition fan-in of the row in question reaches the main input of the logic circuit network.

14. A logic circuit optimizing system comprising:

logic circuit network generating means for inputting a logical expression group comprising one or more logical expressions and generating a logic circuit network having one or more nodes and branches, wherein each node corresponds to each logical expression and each branch corresponds to a relationship between each logical expression;

matrix generating means for inputting the generated logical circuit network and generating a matrix comprising rows and columns, wherein each row corresponds to the node in said logical circuit network and each column corresponds to an input of said logical circuit and node, and an arbitrary value is given for each element in the column corresponding to the input for the node corresponding to each row;

matrix partitioning means for inputting the generated matrix and extracting a partial matrix containing at least two rows and columns with the arbitrary value at every elements therein from said matrix generated from said matrix generating means;

logic circuit network partitioning means for partitioning a partial circuit corresponding to said partial matrix extracted from said matrix, from said logic circuit network;

optimizing means for optimizing the partial circuit;

logic circuit updating means for updating said logic circuit network by connecting the optimized partial circuit to the corresponding portion of the logic circuit network; and logical expression outputting means for inputting the updated logic circuit network, converting the updated logic circuit network into the logical expression group, and outputting the logical expression group.

15. A logic circuit optimizing system as set forth in claim 14, wherein said logic optimizing means performs optimization of said logic circuit by executing at least a logic decomposition process.

16. A logic circuit optimizing system as set forth in claim 14, which further comprises transitional fan-in matrix generating means for detecting a row corresponding to the node having a transitional fan-in in said logic circuit network, among the matrix generated by said matrix generating means and generating a transitional fan-in matrix taking a transitional fan-in row obtained from a logical OR of said row and the row which transfers the transitional fan-in to said row in question as a row element, and wherein said matrix partitioning means extracts said partial matrix from said transitional fan-in matrix generated by said transitional fan-in matrix generating means in place of the matrix generated by said matrix generating means.

17. A logic circuit optimizing system as set forth in claim 16, wherein said transitional fan-in matrix partitioning means repeats detection of said transitional fan-in with respect to one row within a range satisfying a predetermined constraint.

18. A logic circuit optimizing method comprising the steps of:

inputting a logical expression group comprising one ore more logical expressions and generating a logic circuit network having one or more nodes and branches, wherein each node corresponds to each logical expression and each branch corresponds to a relationship between each logical expression;

inputting the generated logical circuit network and generating a matrix comprising rows and columns, wherein each row corresponds to the node in said logical circuit network and each column corresponds to an input of said logical circuit and node, and an arbitrary value is given for each element in the column corresponding to the input for the node corresponding to each row;

inputting the generated matrix and extracting a partial matrix containing at least two rows and columns with the arbitrary value at every elements therein from said matrix generated from said matrix generating means;

partitioning a partial circuit corresponding to said partial matrix extracted from said matrix, from said logic circuit network;

optimizing the partial circuit;

updating said logic circuit network by connecting the optimized partial circuit to the corresponding portion of the logic circuit network; and inputting the updated logic circuit network, converting the updated logic circuit network into the logical expression group, and outputting the logical expression group.

19. A logic circuit optimizing system as set forth in claim 18, wherein said logic optimizing step is performed for optimization of said logic circuit by executing at least a logic decomposition process.

20. A logic circuit optimizing method as set forth in claim 18, which further comprises a step of detecting a row corresponding to the node having a transitional fan-in in said logic circuit network, among the matrix generated by said matrix generating means and generating a transitional fan-in matrix taking a transitional fan-in row obtained from a logical OR of said row and the row which transfers the transitional fan-in to said row in question as a row element, and wherein said step of extracting said partial matrix extracts the partial matrix from said transitional fan-in matrix generated by said transitional fan-in matrix generating step in place of the matrix generated by said matrix generating step.

21. A logic circuit optimizing system as set forth in claim 20, wherein said logic optimizing step is performed for optimization of said logic circuit by executing at least a logic decomposition process.

* * * * *